(12) United States Patent
Gooch et al.

(10) Patent No.: US 9,174,836 B2
(45) Date of Patent: *Nov. 3, 2015

(54) INTEGRATED BONDLINE SPACERS FOR WAFER LEVEL PACKAGED CIRCUIT DEVICES

(71) Applicant: Raytheon Company, Waltham, MA (US)

(72) Inventors: Roland Gooch, Dallas, TX (US); Buu Diep, Murphy, TX (US); Thomas Allan Kocian, Dallas, TX (US); Stephen H. Black, Goleta, CA (US); Adam M. Kennedy, Santa Barbara, CA (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/456,156

(22) Filed: Aug. 11, 2014

(65) Prior Publication Data

US 2014/0346643 A1    Nov. 27, 2014

Related U.S. Application Data

(60) Continuation of application No. 14/202,756, filed on Mar. 10, 2014, which is a division of application No. 13/667,458, filed on Nov. 2, 2012, now Pat. No. 8,736,045.

(51) Int. Cl.
*H01L 23/12* (2006.01)
*B81B 7/00* (2006.01)
(Continued)

(52) U.S. Cl.
CPC .............. *B81B 7/0041* (2013.01); *B81B 7/007* (2013.01); *B81C 1/00269* (2013.01); *H01L 23/053* (2013.01); *H01L 24/83* (2013.01); *B81C 2203/019* (2013.01); *H01L 24/27* (2013.01); *H01L 24/29* (2013.01); *H01L 2224/27444* (2013.01); *H01L 2224/27462* (2013.01);
(Continued)

(58) Field of Classification Search
CPC ............... H01L 2924/01079; H01L 23/10; H01L 2224/16; H01L 2924/16152; H01L 2924/01078
USPC ......................................... 257/704
See application file for complete search history.

(56) References Cited

U.S. PATENT DOCUMENTS 5,232,962 A    8/1993   Dershem et al.
6,586,831 B2   7/2003   Gooch et al.
(Continued)

OTHER PUBLICATIONS

International Search Report; International Application No. PCT/US 13/66266; International Filing Date: Oct. 23, 2013; Date of mailing: Mar. 18, 2014; 11 pages.
Written Opinion; International Application No. PCT/US 13/66266; International Filing Date: Oct. 23, 2013; Date of mailing: Mar. 18, 2014; 5 pages.

*Primary Examiner* — Quoc Hoang
(74) *Attorney, Agent, or Firm* — Cantor Colburn LLP

(57) ABSTRACT

A method of forming a wafer level packaged circuit device includes forming a device wafer, the device wafer including a first group of one or more material layers left remaining in a first region of a substrate of the device wafer; and forming a cap wafer configured to be attached to the device wafer, the cap wafer including a second group of one or more material layers left remaining in a second region of a substrate of the cap wafer; wherein a combined thickness of the first and second groups of one or more material layers defines an integrated bond gap control structure upon bonding of the device wafer and the cap wafer.

23 Claims, 13 Drawing Sheets

(51) Int. Cl.
*B81C 1/00* (2006.01)
*H01L 23/053* (2006.01)
*H01L 23/00* (2006.01)

(52) U.S. Cl.
CPC . *H01L2224/27464* (2013.01); *H01L 2224/291* (2013.01); *H01L 2224/29011* (2013.01); *H01L 2224/83001* (2013.01); *H01L 2224/83007* (2013.01); *H01L 2224/8314* (2013.01); *H01L 2224/83139* (2013.01); *H01L 2224/83141* (2013.01); *H01L 2224/83192* (2013.01); *H01L 2924/1461* (2013.01); *H01L 2924/163* (2013.01)

(56) References Cited

U.S. PATENT DOCUMENTS

| | | | |
|---|---|---|---|
| 8,736,045 B1 * | 5/2014 | Gooch et al. | 257/704 |
| 2005/0263878 A1 | 12/2005 | Potter | |
| 2007/0190747 A1 * | 8/2007 | Humpston et al. | 438/460 |
| 2009/0266480 A1 | 10/2009 | Cordes et al. | |
| 2011/0156074 A1 | 6/2011 | Liu et al. | |
| 2012/0096813 A1 | 4/2012 | Gooch et al. | |
| 2012/0111492 A1 | 5/2012 | Diep et al. | |
| 2012/0132522 A1 | 5/2012 | Foster et al. | |
| 2013/0058202 A1 | 3/2013 | Chou et al. | |

\* cited by examiner

INTEGRATED BONDLINE SPACERS FOR WAFER LEVEL PACKAGED CIRCUIT DEVICES

CROSS-REFERENCE TO RELATED APPLICATIONS

This application is a continuation of U.S. patent application Ser. No. 14/202,756, filed Mar. 10, 2014, which is a divisional application of U.S. patent application Ser. No. 13/667,458, filed Nov. 2, 2012, now U.S. Pat. No. 8,736,045, and all the benefits accruing therefrom under 35 U.S.C. §119, the contents of which in its entirety are herein incorporated by reference.

BACKGROUND

The present disclosure relates generally to semiconductor device manufacturing and, more particularly, to bond gap control structures (BGCS) for wafer level packaged optical microelectromechanical systems (MEMS) devices.

Microelectromechanical systems (MEMS) are integrated micro devices or systems combining electrical and mechanical components. MEMS devices may be fabricated using, for example, standard integrated circuit batch processing techniques. Exemplary applications for MEMS devices include sensing, controlling, and actuating on the micro scale. Such MEMS devices may function individually or in arrays to generate effects on a macro scale.

Many MEMS devices require a vacuum environment in order to attain maximum performance. The vacuum package also provides protection and an optimal operating environment for the MEMS device. Specific examples of these MEMS devices include infrared MEMS such as bolometers, and certain inertial MEMS such as gyros and accelerometers. Previously, MEMS devices have been individually packaged in vacuum compatible packages after fabrication and dicing of the MEMS device. Often, however, the cost of packaging MEMS devices in traditional metal or ceramic packages may be on the order of about 10 to 100 times the device fabrication cost. This especially true if a vacuum is required in the package. These high packaging costs therefore make it difficult to develop commercially viable vacuum packaged MEMS devices. In addition, MEMS devices are fragile especially after dicing. Care must be taken in handling these devices, and traditional integrated circuit fabrication machinery cannot adequately handle and protect MEMS devices. Thus, special handling techniques have also been developed to protect the MEMS devices until vacuum packaging has been completed. These special handling procedures also add additional cost to the production of MEMS devices.

Wafer Level Packaging (WLP) was developed to address the high cost of packaging of MEMS by eliminating the traditional packages. In the WLP process, two semiconductor wafers may be bonded together using a joining material to yield bonded wafers. For example, a device wafer may be bonded to a lid wafer using an adhesive or solder to form a packaged MEMS device. Certain applications may require that the joining material form a substantially uniform bond line. In certain situations, substrates (such as silicon wafers) may be bonded together using a joining material. After bonding, the joining material forms a bond line in between the substrates. However, the uniformity of the bond line may be affected by the flatness of the substrates and the uniformity of the bond force used to bond the wafers. The uniformity of the bond line may be controlled by placing spacers at certain intervals across the surface of one or both substrates. However, adding the spacers usually requires adding process steps to the fabrication process.

SUMMARY

In an exemplary embodiment, a method of forming a wafer level packaged circuit device includes forming a device wafer, the device wafer including a first group of one or more material layers left remaining in a first region of a substrate of the device wafer; and forming a cap wafer configured to be attached to the device wafer, the cap wafer including a second group of one or more material layers left remaining in a second region of a substrate of the cap wafer; wherein a combined thickness of the first and second groups of one or more material layers defines an integrated bond gap control structure upon bonding of the device wafer and the cap wafer.

In another embodiment, a method of forming a wafer level packaged circuit device includes forming a device wafer, the device wafer including a polyimide layer formed in a first region of a substrate of the device wafer, and a first solder metal stack layer formed on the polyimide layer, wherein the polyimide layer is a same polyimide layer that is also used in the formation of microelectromechanical systems (MEMS) devices of an integrated circuit on the device wafer, and the first solder metal stack layer is also a same first solder metal stack layer used to form a sealing ring for the device wafer; forming a cap wafer, the cap wafer including an antireflective coating layer formed in a second region of a substrate of the cap wafer, and a second solder metal stack layer formed on the antireflective coating layer, wherein the antireflective coating layer is a same antireflective coating layer that is also formed on a cavity portion of the cap wafer, and the second solder metal stack layer is also a same second solder metal stack layer used to form a sealing ring for the cap wafer; and bonding the cap wafer to the device wafer, thereby defining an integrated bond gap control structure comprising the polyimide layer, the first solder metal stack layer, the second solder metal stack layer, and the antireflective coating layer. If a getter is used in the package, it may also be included in the BGCS structure described above.

In another embodiment, a wafer level packaged circuit device includes a device wafer bonded to a cap wafer. The device wafer includes a polyimide layer formed in a first region of a substrate of the device wafer, and a first solder metal stack layer formed on the polyimide layer, wherein the polyimide layer is a same polyimide layer that is also used in the formation of an integrated circuit on the device wafer, and the first solder metal stack layer is also a same first solder metal stack layer used to form a sealing ring for the device wafer. The cap wafer includes an antireflective coating layer formed in a second region of a substrate of the cap wafer, and a second solder metal stack layer formed on the antireflective coating layer, wherein the antireflective coating layer is a same antireflective coating layer that is also formed on a cavity portion of the cap wafer, and the second solder metal stack layer is also a same second solder metal stack layer used to form a sealing ring for the cap wafer; and an integrated bond gap control structure (BGCS) disposed between the device wafer and the cap wafer, the integrated BGCS comprising the polyimide layer, the first solder metal stack layer, the second solder metal stack layer, and the antireflective coating layer.

In another embodiment, a method of forming a wafer level packaged circuit device includes forming a device wafer; forming a cap wafer; forming, on either the cap wafer or the device wafer, a bond gap control structure comprising one or more material layers used in the formation of either the cap wafer or the device wafer, and left remaining in a region of a substrate of either the cap wafer or the device wafer; and bonding the cap wafer to the device wafer.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

Figure 1A:
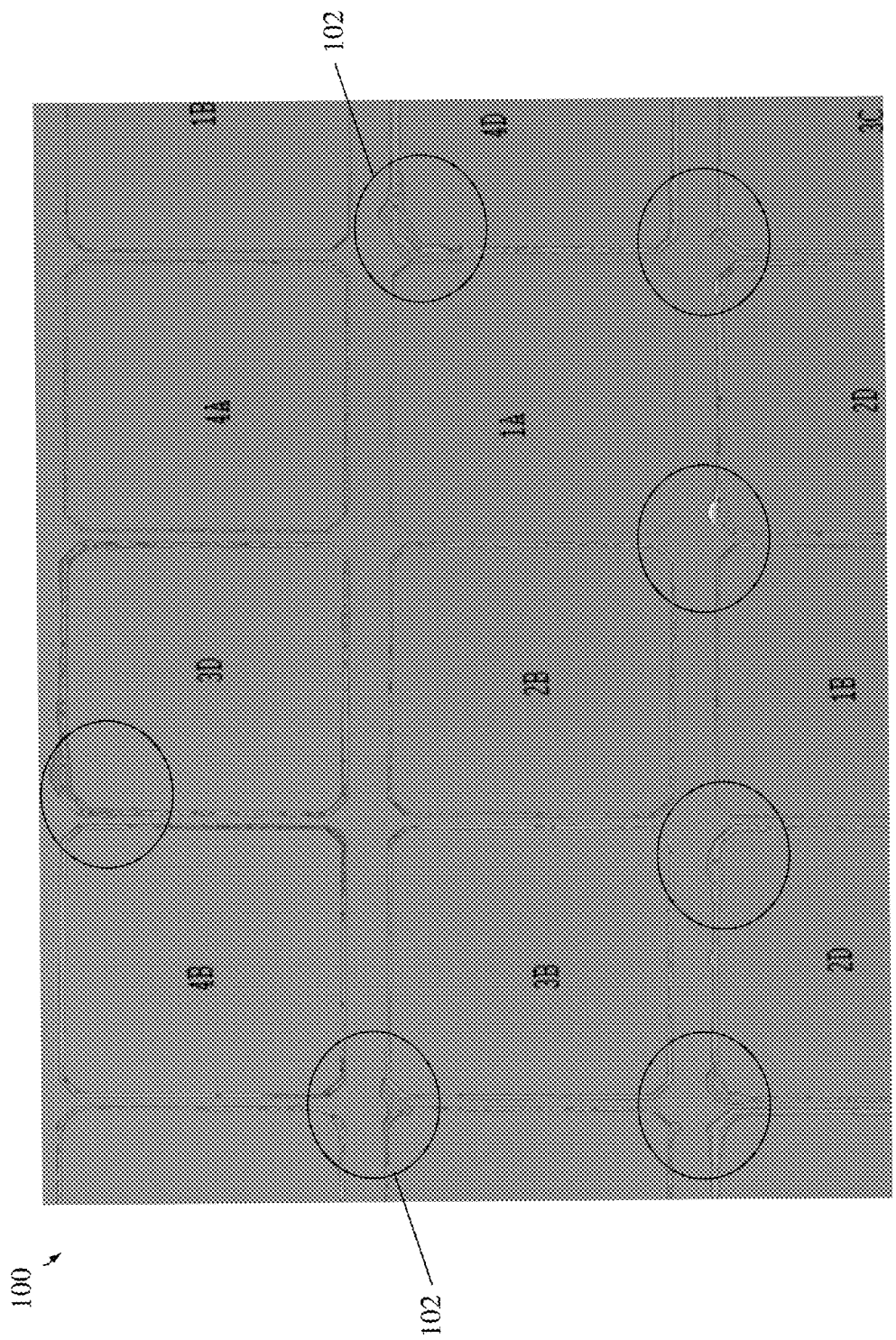
FIG. 1(a) illustrates a top down acoustic image of a bonded pair of wafers without a BGCS showing the results of nonuniformity of the bond line.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature(s) being described. Also, the description is not to be considered as limiting the scope of the embodiments described herein.

As indicated above, infrared MEMS devices and certain other inertial MEMS devices require a vacuum environment to attain maximum performance. For example, infrared microbolometers require an operating pressure of less than 10 millitorr (mT) to minimize thermal transfer from the detector elements to the substrate and package walls. Thus, vacuum compatible materials processes and equipment must be used. Infrared devices also require an optically transparent cover. These packaging requirements translate to high labor and capital expense and present a significant cost barrier to commercially viable MEMS devices. Traditional MEMS device packaging costs can be ten to one hundred times the basic device fabrication cost even in reasonably high volume.

A solution to high packaging costs is to eliminate the traditional individual vacuum packaging of a completed die. More specifically, this is achieved by moving the packaging step into the wafer fabrication area. A cap wafer is aligned and mounted to the device wafer with an annular seal ring of solder, or other sealing material, forming an enclosed cell at each die location. This cap attachment process is completed in a vacuum environment, leaving each MEMS device in a vacuum cell. Interconnects are brought out under the solder seal ring and are isolated by a dielectric layer.

Figure 1B:
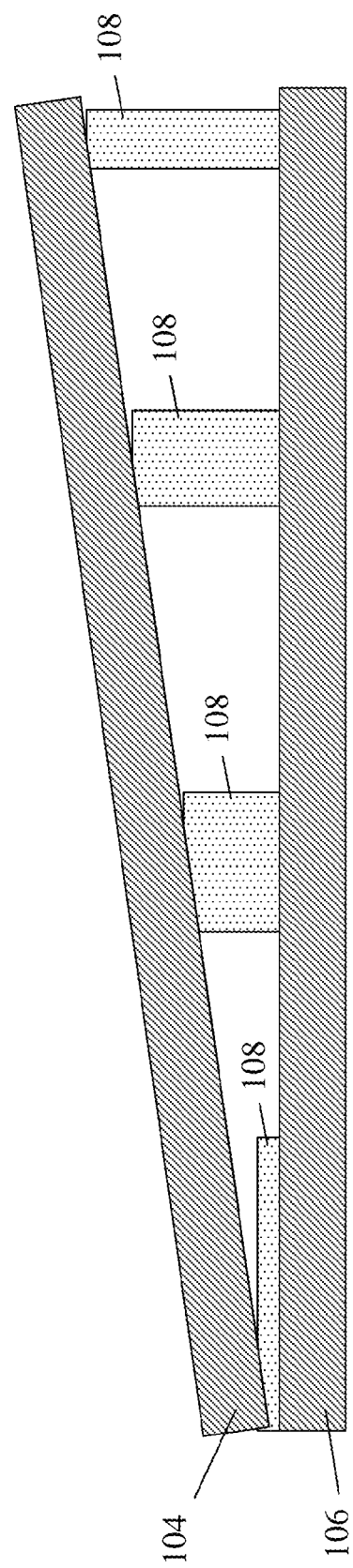
FIG. 1(b) is a side cross sectional view of a bonded pair of wafers without a BGCS showing nonuniformity of the bond line, and causing solder to flow outside a specified bond region.

FIG. 1(a) illustrates an image of a bonded pair of wafers 100. When bonding two wafers together, regardless of whether the joining material is solder, adhesive, or some other intermediates, the flatness of the substrates and the amount and uniformity of bond force largely determine the bond line geometries in terms of gap (thickness) and width. As illustrated in the circled regions 102, the bonded wafer pair 100 exhibits bond width and gap uniformity issues in the absence of a bond gap control structure or spacer (BGCS). As further depicted in the side cross sectional view of FIG. 1(b), the bonded pair of wafers 104, 106, without a BGCS further results in causing solder 108 to flow outside a specified bond region.

A BGCS may serve as a mechanical stop that controls the thickness of a bond line between two surfaces joined by solder, adhesive, or other joining material, and also prevents the joining material from spreading in an undesired manner. In certain embodiments, a BGCS may be disposable (i.e., may be removed during wafer dicing). If the BGCS is formed from materials that are not otherwise used in the formation of either the cap wafer or the device wafer (e.g., a polyimide or other material), then this results in additional processing steps. Any additional process or processes can in turn increase the risk of adding contamination in the form of particles or chemical residues to the optical window surfaces that are difficult to clean.

Accordingly, in the present embodiments, existing layers used in the formation of an integrated circuit wafer (e.g., an infrared (IR) detector) and/or a cap wafer can now also be advantageously used in the formation of bond gap spacers. Rather than forming additional layers on completed device and cap wafers, the package fabrication process may easily be modified to leave small regions of these layers to form spacers of the materials that are already integral to the process. In so doing, the present embodiments eliminate a separate spacer forming step in the cap wafer fabrication, which in turn involves spraying or spinning a separate layer of polyimide material (for example) on the wafer, photo-patterning the spacers, baking the material to harden it, and removing all residual traces from the optical surfaces. Further, this approach also eliminates a possible need for capital equipment for the spray deposition of the polyimide, as it is often not compatible with photoresist dispensing equipment. Still another advantage is the simplification of the packaging process and enhancement of product yield by reducing risk of leaving residue on optical surfaces. Residue and particles are a prime caused of rejection for optical failures, and organic residue in the package is a prime cause of loss due to poor vacuum and shortened product life.

Figure 2:
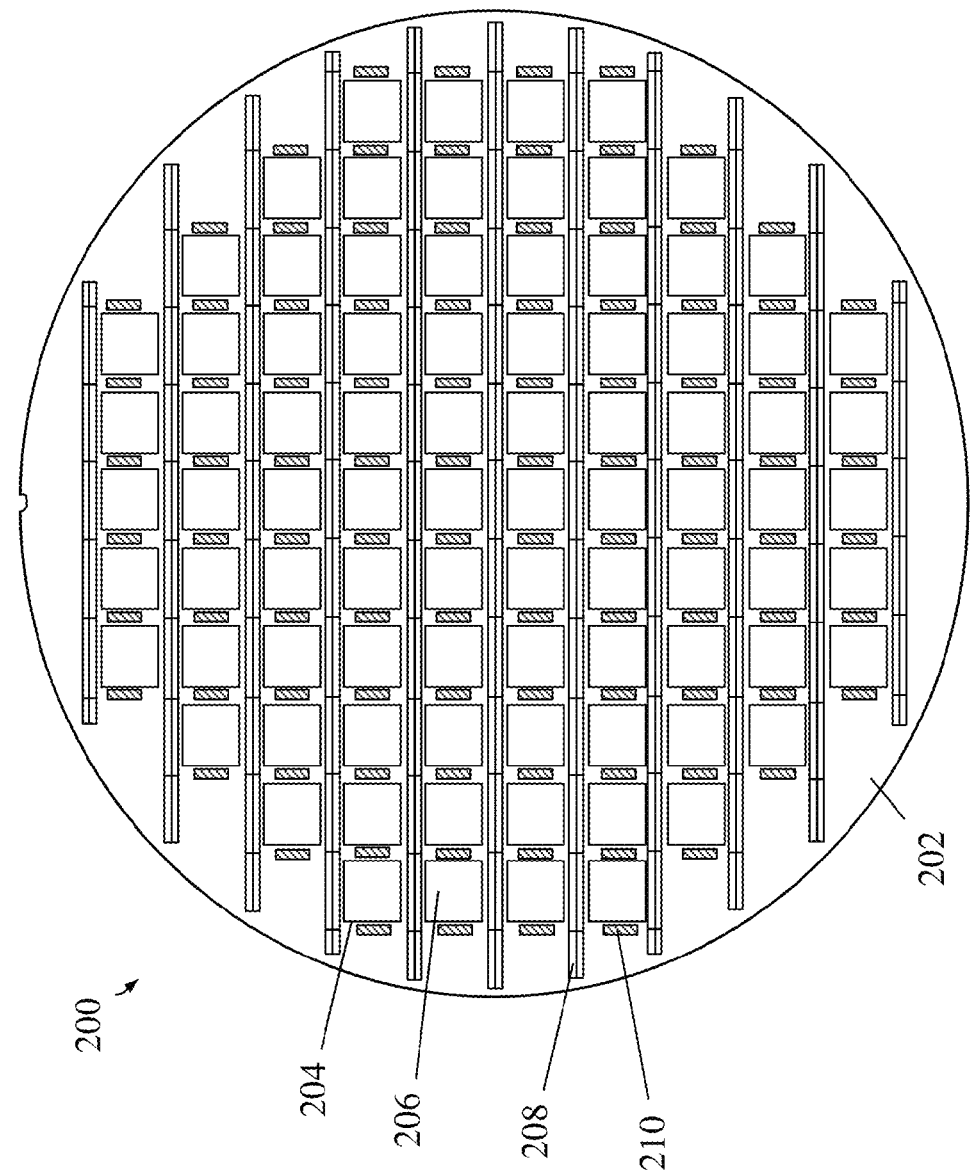
FIG. 2 is a top view of a patterned side of an exemplary cap wafer that may be used in accordance with the teachings herein.

Referring now to FIG. 2, there is shown a top view of a patterned side of an exemplary cap wafer 200 that may be used in accordance with the teachings herein. The cap wafer 200 may, in one embodiment include a silicon substrate 202, although any suitable wafer substrate material may be used. The cap wafer 200 includes a plurality of cap sealing rings 204 corresponding in number to device sealing rings on an integrated circuit device wafer (not shown in FIG. 2). Each of the cap sealing rings 204 corresponds to a device sealing ring so that the cap wafer 200 mates with a device wafer. Cavities 206 and bonding pad channels 208 are formed in the cap wafer 200 using an appropriate process such as wet or dry etching.

The cavities 206 provide an increased volume for a vacuum packaged MEMS device (not shown in FIG. 2), which in turn provides for a lower vacuum pressure level within the vacuum cell. The bonding pad channels 208 may be used to provide clearance over bonding pads (not shown in FIG. 2) so that a dicing saw, etching process, or other suitable process may be used in a later step to open the lid wafer to expose the bonding pads for device testing before dicing of the wafer.

As further depicted in FIG. 2, the cap wafer 200 includes a plurality of bond gap control structures 210 adjacent the outer perimeter of the cap sealing rings 204. Again, the bond gap control structures 210 serve as a mechanical stop that controls the thickness of a bond line between two joined surfaces. In the embodiment illustrated, the bond gap control structures 210 are schematically depicted as single structures disposed in a y-axis direction with respect to FIG. 2, whereas the bonding pad channels 208 are generally disposed in an x-axis direction with respect to FIG. 2. However, other arrangements are also possible with respect to the cap wafer 200.

Figure 3:
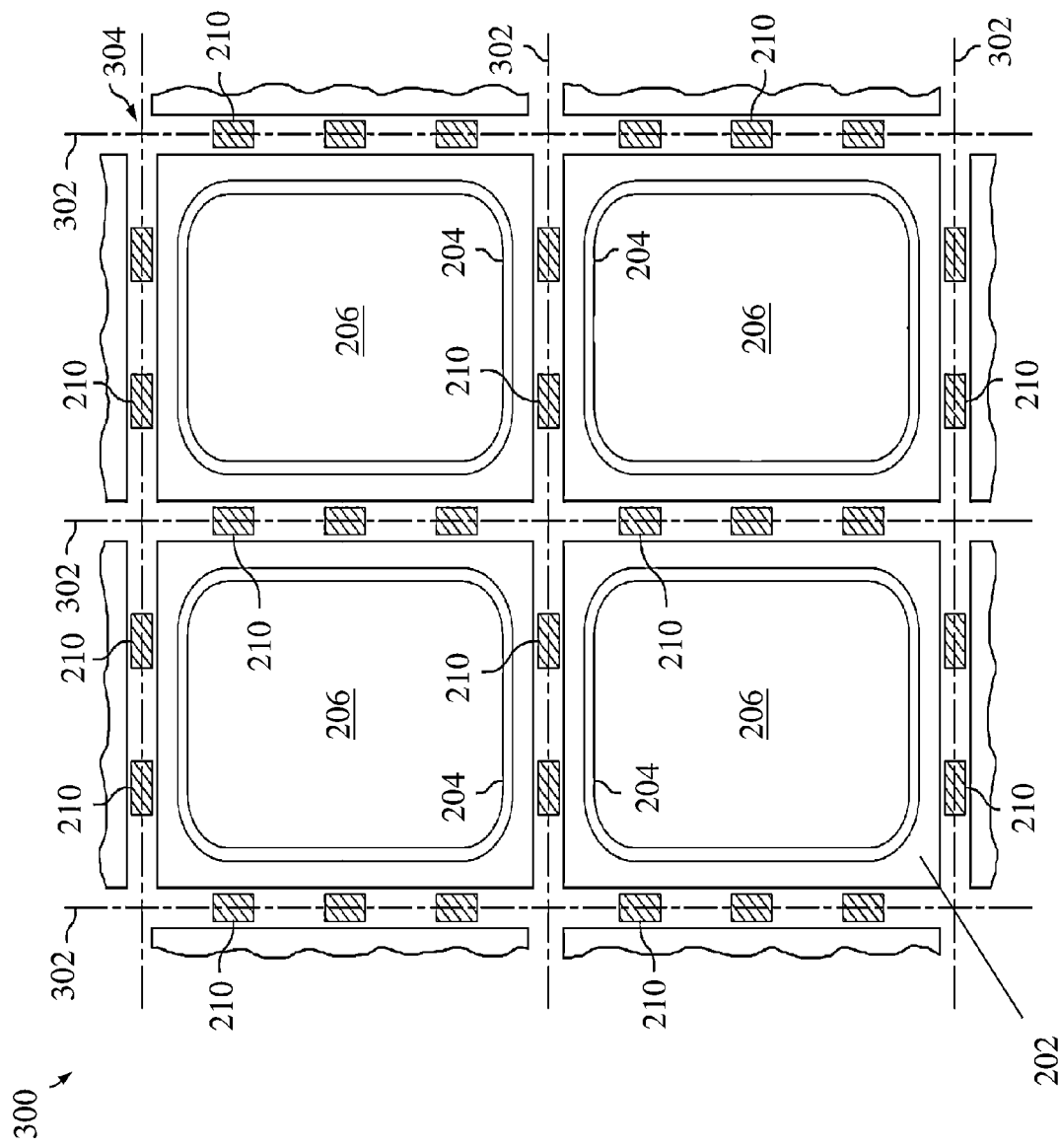
FIG. 3 is an enlarged top view of a patterned side of an exemplary cap wafer that may be used in accordance with the teachings herein.

For example, FIG. 3 is an enlarged top view of a patterned side of an exemplary cap wafer 300 that may also be used in accordance with the teachings herein. For ease of illustration, like reference numbers with respect to FIG. 2 are used in FIG. 3. As is shown in the more detailed view of FIG. 3, the substrate 202 has saw lines 302 depicted approximately in the center of scribe regions 304 where the substrate 202 is to be cut. In this embodiment, a plurality of BGCSs 210 are disposed within the scribe regions 304, in both the x-axis and y-axis directions to operate as a mechanical stop that controls the geometry of a bond line of a cap sealing ring 204. In an exemplary embodiment, the BGCS may only need to be disposed in either the x-axis or y-axis directions. The geometry of a bond line includes both gap thickness and width. The gap refers to the gap between bonded substrates, wherein the gap thickness is measured in a direction that is perpendicular to the flat surface of the substrate 202. The width is measured along the flat surface of substrate 202. A BGCS 210 may have any suitable size and shape. For example, each BGCS 210 may have a width in any of the following ranges 1 to 10, 10 to 50, 50 to 100, or over 100 microns (µm), a length in any of the following ranges 50 to 100, 100 to 200, or over 200 µm, and a thickness in any of the following ranges 1 to 5, 5 to 10, 10 to 20, or over 20.

Figure 4:
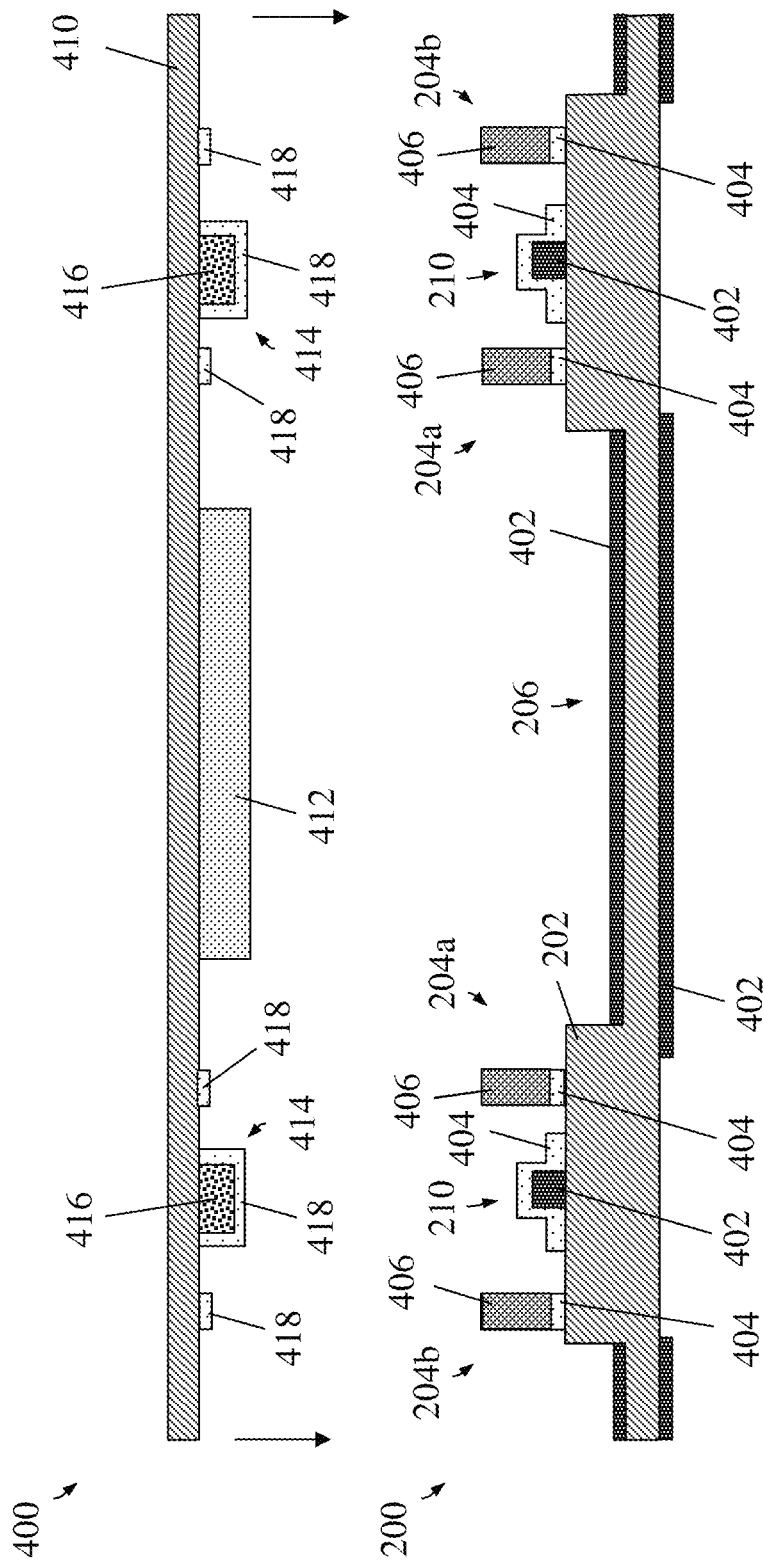
FIG. 4 is a side cross sectional view of a portion of a device wafer to be bonded to a corresponding portion of a cap wafer that results in the formation of integrated BGCSs, in accordance with an exemplary embodiment.

Referring now to FIG. 4, there is shown a side cross sectional view of a portion of a device wafer 400 to be bonded to a corresponding portion of a cap wafer 200. Again, for ease of illustration, like reference numbers with respect to the cap wafers of FIGS. 2 and 3 are used in FIG. 4. As depicted in FIG. 4, the cap wafer 200 is shown in a bottom, cavity-up orientation and includes the substrate 202, etched out cavity 206, and a cap sealing ring 204a that surrounds the cavity 206. Adjacent sealing rings 204b are also shown for adjacent cavities on the cap wafer 202 for illustrative purposes. A cap wafer portion of each BGCS 210 is also illustrated on the cap wafer 200 in FIG. 4.

As indicated above, in contrast to using special materials to form BGCSs, the BGCSs are instead formed using existing materials for both the cap wafer 200 and the device wafer 400. In the case of the cap wafer 200, a first layer for the BGCS 210 may include an antireflective (AR) coating layer 402 also formed on the thinned portions of the substrate 202 (i.e., corresponding to locations of the cavities 206 that will cover the corresponding MEMS devices on the device wafer 400), in accordance with the fabrication of infrared detectors or other such optical devices. In an exemplary embodiment, the AR portion of the BGCS 210 may have a thickness on the order of about 5.5 µm to about 8.0 µm, and more specifically about 7.0 µm. In order to form the AR coating layer 402 at the BGCS locations, in addition to the existing locations on the cap wafer, the applicable patterning mask(s) are modified so that the AR material remains in the BGCS locations.

In addition, a second layer for the BGCS 210 may include a solder base metal stack layer 404 that is also used as a solder base for the sealing rings 204a, 204b. The solder metal stack layer may include, for example, a layer of titanium (Ti), followed by a layer of nickel (Ni), and followed by a layer of gold (Au). Other metals, however, may also be used. The combined metal stack layer 404 may have an exemplary thickness on the order of about 0.4 µm to about 0.8 µm, and more specifically about 0.6 µm. The formation of the cap wafer is completed with the addition of an appropriate solder metal layer 406 atop the metal stack layer 404 of the sealing rings 204a, 204b. If a sealing method other than heat activated solder is used, solder metal layer 406 is replaced by a material selected to obtain a vacuum tight seal. The solder metal layer 406 may be deposited through traditional integrated circuit fabrication techniques or other suitable deposition processes including, but not limited to, electroplating, electroless plating, and vacuum deposition.

Turning now to the device wafer 400, a substrate wafer 410 (e.g., silicon) has a plurality of IC devices 412 formed thereon. The IC devices 412 may be MEMS devices such as a bolometer, for example, formed using traditional methods of integrated circuit fabrication. Although the present embodiment is discussed in terms of vacuum packaging for MEMS devices, the principles disclosed herein may be applied to vacuum packaging of any integrated circuit device, or similar device, formed on a substrate material and contained within a vacuum package. Each IC device 412 is configured to be aligned with a corresponding cavity 206 on the cap wafer 200. As is the case with the cap wafer 200, the device wafer 400 may be formed with one or more materials that match up with materials on the cap wafer 200 to formed integrated BGCSs. In FIG. 4, a device wafer portion of each BGCS is indicated at 414. That is, the device wafer portion 414 of a BGCS and the cap wafer portion 210 of a BGCS are mated to form an integrated BGCS, as shown hereinafter.

With respect to the device wafer 400, a first layer for the device wafer portion 414 of a BGCS may include a sacrificial polyimide layer 416 that is used to thermally isolate the IC device 412 (e.g., bolometer) from the substrate 410. In this sense, the polyimide layer 416 is not sacrificial in the BGCS regions, in that that layer patterning is adjusted such that the polyimide remains to contribute to the overall BGCS thickness. In an exemplary embodiment, the polyimide layer 416 may have a thickness on the order of about 1.8 μm to about 2.0 μm.

As is the also case with the cap wafer 200, the device wafer 400 is provided with a solder base metal stack layer 418 that is used as a solder base to mate with the solder metal 406 atop the metal stack layer 404 of the sealing rings 204a, 204b. The solder metal stack layer 418 may also include a Ti/Ni/Au stack similar to stack 404, and at a substantially same thickness. In addition to serving as a solder base for sealing rings on the device wafer, the metal stack layer 418 may also serve as a second layer for the device wafer portion 414 of a BGCS. As particularly illustrated in FIG. 4, patterning of the metal stack layer 418 is such that it covers not only the top surface of the polyimide layer 416, but also the sidewall surfaces thereof.

With both the cap wafer 200 and device wafer 400 configured as depicted in FIG. 4, the arrangement is ready for final assembly. To prepare the assembly, the cap wafer 200 may be placed in an assembly holder (not shown) with the solder layer 406 facing up. The device wafer 400 is aligned over the cap wafer 200 such that the metal stack layers 418 (i.e., not the metal stack layers 418 that are part of the integrated BGCS) are aligned over the corresponding cap wafer sealing rings 204a, 204b.

Figure 5:
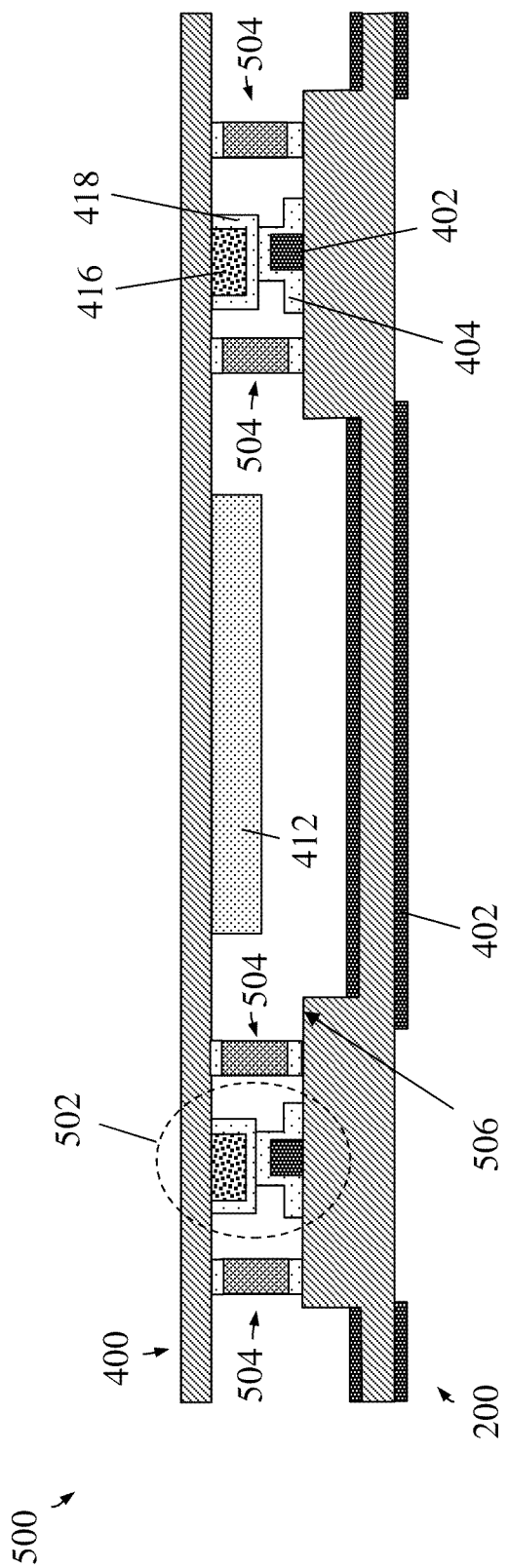
FIG. 5 is a side cross sectional view illustrating bonding of the device and cap wafers of FIG. 4.

FIG. 5 depicts the joining of the cap wafer 200 with the device wafer 400 to form an assembly 500. As can be seen, an integrated BGCS indicated at the circled region 502 is defined by the combined material stack that includes the AR and solder metal layer 402, 404, respectively from the cap wafer 200 and the solder metal layer and polyimide layers 418, 416, respectively, from the device wafer 400. The integrated BGCSs, like previous spacers, allow for good solder bond width and gap uniformity characteristics for the now-formed bond lines 504 in FIG. 5, but without the need to form the BGCSs using additional materials not otherwise used in forming either the cap wafer 200 or the device wafer 400. In total, the bond lines may have an exemplary thickness on the order of about 10 μm as result of the combined thicknesses of the AR, polyimide and metal layers left in the scribe regions of the cap and device wafers.

After any appropriate testing of the MEMS devices 12, the assembly 500 is diced by sawing along, for example, a saw line 302 such as shown in FIG. 3, which may or may not result in the removal of the integrated BGCS shown at 502 in FIG. 5. The dicing of the assembly 500 may be accomplished by using traditional methods of dicing semiconductor wafers with completed integrated circuits. By vacuum packaging MEMS devices 412 at the wafer level, traditional methods of handling integrated circuit devices may be used since the vacuum package provides protection to the delicate MEMS device 412. A completed die representing a vacuum packaged MEMS device 412 may be mounted by chip-on-board methods or injection molded into a plastic package (not shown). In addition, a completed die may be placed in a non-vacuum package with other components (not shown).

Although the integrated BGCSs 502 in FIG. 5 is shown disposed in or proximate to a scribe region in between adjacent bond lines 504, it is also contemplated that the BGCSs 502 may also be positioned in additional locations. For example, the BGCS materials from the cap wafer 200 and device wafer 400 could be patterned such that one or more BGCSs 502 reside within the confines of the sealed cavity, such as at location 506 for example. In this case, the BGCS 502 would remain as part of the completed product, after dicing.

Figure 6:
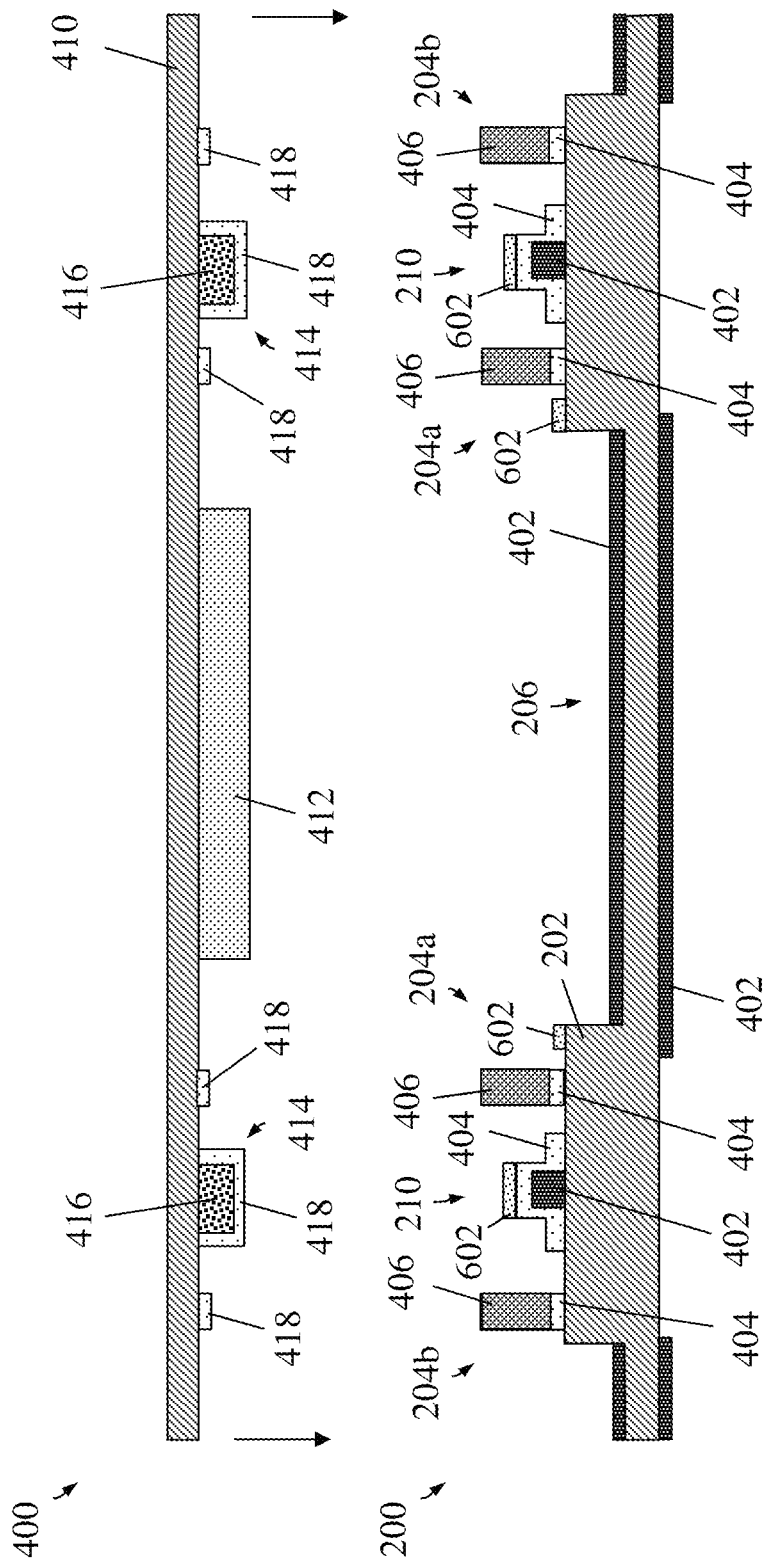
FIG. 6 is a side cross sectional view of a portion of a device wafer to be bonded to a corresponding portion of a cap wafer that results in the formation of integrated BGCSs, in accordance with another exemplary embodiment.

Referring now to FIG. 6, there is shown a side cross sectional view of a portion of a device wafer 400 to be bonded to a corresponding portion of a cap wafer 200 that results in the formation of integrated BGCSs, in accordance with another exemplary embodiment. In this embodiment, an additional layer used in the processing of the cap wafer is also intentionally left in the scribe region of the substrate 202 in order to contribute to the overall thickness of the BGCS. More specifically, the cap wafer 200 includes a vacuum getter layer 602 initially formed on the inside surfaces of the cap substrate 202 over the AR layer, corresponding to the etched cavity regions 206. Generally, a getter is a deposit of reactive material that is placed inside a vacuum system, for the purpose of completing and maintaining the vacuum. When gas molecules strike the getter material, the molecules combine with the getter chemically or by adsorption, removing small amounts of gas from the evacuated space. The getter layer 602 may include one or more layers of elements such as titanium, zirconium, iron, and vanadium, to name a few examples.

Figure 7:
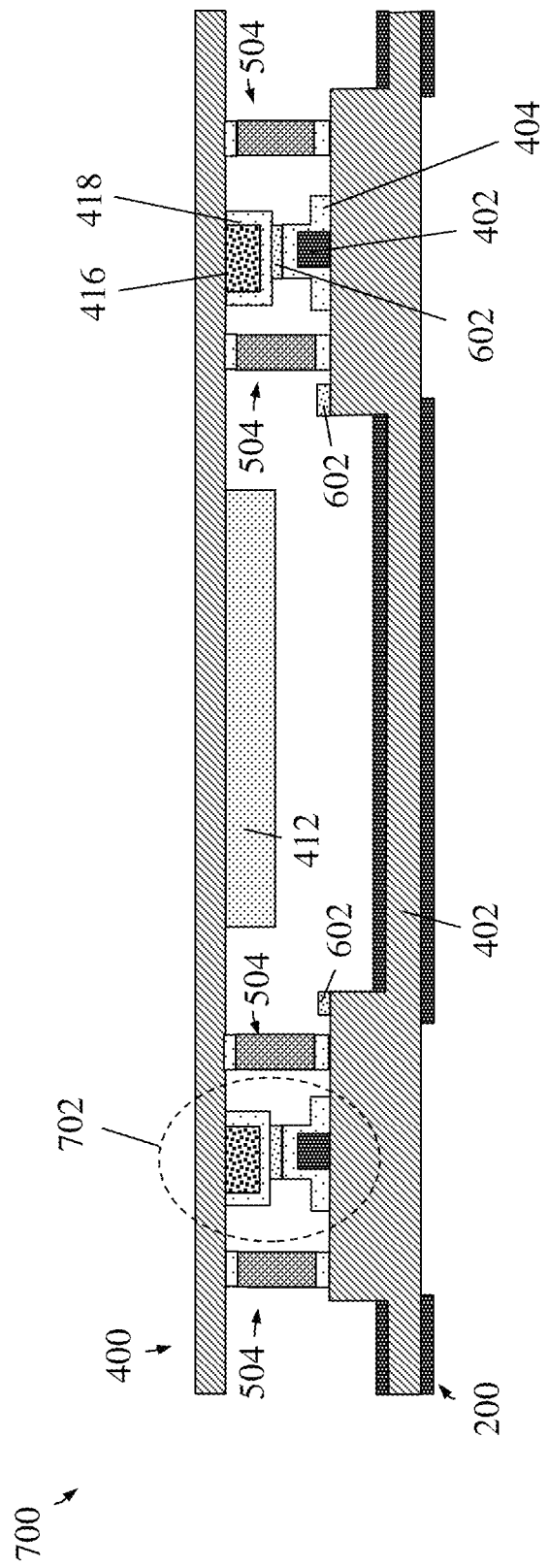
FIG. 7 is a side cross sectional view illustrating bonding of the device and cap wafers of FIG. 6.

As further seen in FIG. 6, the getter layer 602 is left remaining atop the AR and solder base metal layers 402, 404, respectively, to become a part of the cap wafer portion of each BGCS 210. In the bonded view of FIG. 7, the assembly 700 includes integrated BGCSs, indicated by the dashed circled region 702. In an exemplary embodiment, the getter layer 602 may have a thickness on the order of about 0.3 μm to about 2.0 μm, and more specifically about 0.9 μm. As such, the embodiment of FIGS. 6 and 7, which uses the additional getter layer 602 in forming a BGCS, may provide for an additional bond line thickness of about 1.0 μm or more with respect to the embodiment of FIGS. 4 and 5.

Figure 9:
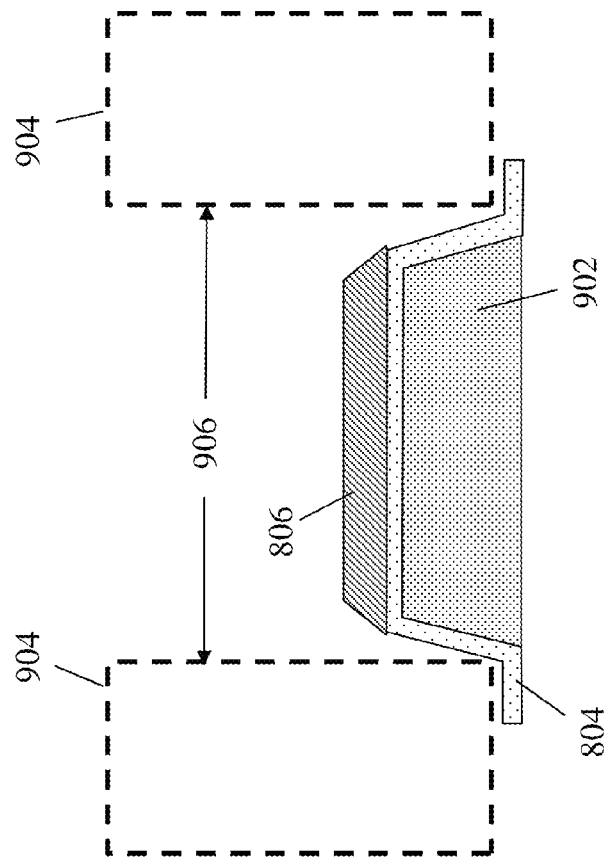
FIG. 9 is a cross sectional, perspective view illustrating the placement of the vacuum getter layer atop the solder metal layer of FIG. 8.
Figure 8:
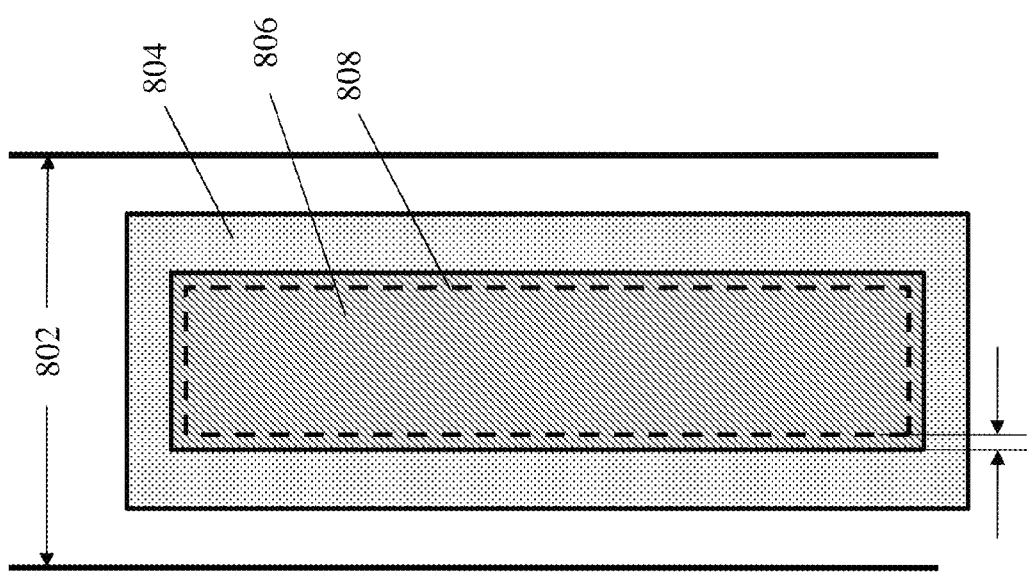
FIG. 8 is a top view illustrating the placement of a vacuum getter layer atop the solder base metal layer of the cap wafer in the embodiment of FIGS. 6 and 7.

In order to achieve a desired plateau width for the portions of the getter layer 602 that become a part of the BGCSs, an allowance may be made for shadowing of the getter deposition mask, as more particularly illustrated in FIGS. 8 and 9. In the top view of FIG. 8, reference number 802 depicts a width of a saw lane on the scribe region of the cap wafer substrate. The saw lane 802 may be on the order of about 480 μm. Region 804 represents the solder metal stack portion of the BGCS that covers the top and sidewall surfaces of the AR layer (not shown in FIG. 8). Region 806 represents the getter layer portion of the BGCS that overlaps the top surface or plateau of the solder base metal, which is depicted by the dashed line 808. In an embodiment, an exemplary width 810 of a shadowed edge overlap of the getter layer is on the order of about 40 μm.

FIG. 9 is a cross sectional, perspective view illustrating the placement of the vacuum getter layer 806 atop the solder metal layer stack 804 of FIG. 8. In this view, the AR layer depicted by region 902 is shown. The dashed lines 904 represent regions of a getter shadow mask, wherein a spacing 906 between the regions (i.e., the shadow mask opening width) represents the plateau width of the top of the solder metal stack 804 plus the shadowed edge width 810.

In the embodiments described above, the BGCSs are formed using existing materials for both the cap wafer 200 and the device wafer 400. However, it is also contemplated that the BGCS material could be formed from existing layers on either the cap wafer 200 alone or on the wafer layer 400 alone. In such a case, the overall thickness of the BGCSs may be reduced and/or in the alternative, the existing layers used to form the cap wafer 200 or the device wafer 400 may be formed at a greater initial thickness so as to compensate for the BGCS material being formed on only one of the two wafers.

Figure 10:
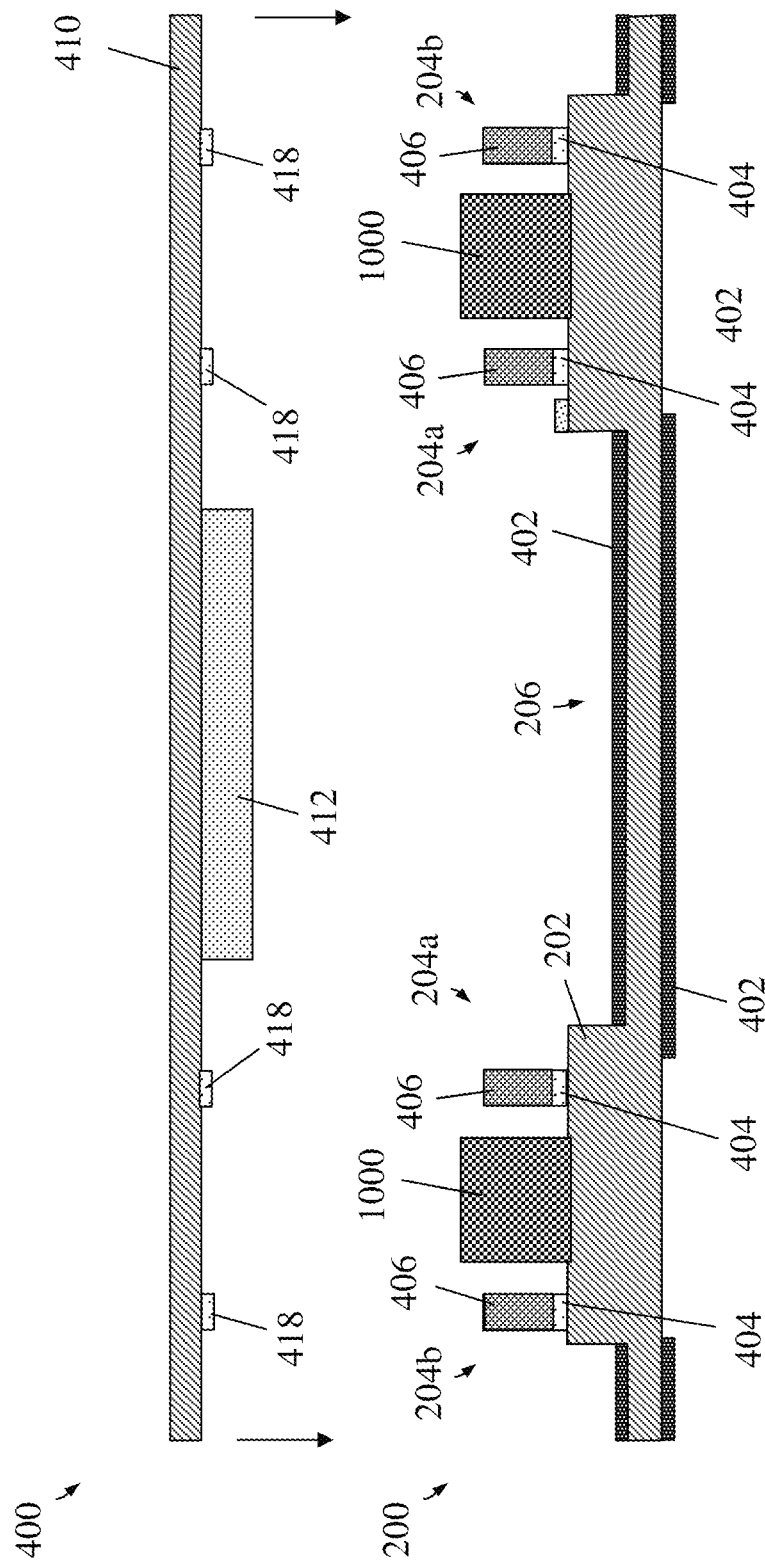
FIG. 10 is a side cross sectional view of a portion of a device wafer to be bonded to a corresponding portion of a cap wafer that results in the formation of integrated BGCSs, in accordance with another exemplary embodiment.
Figure 11:
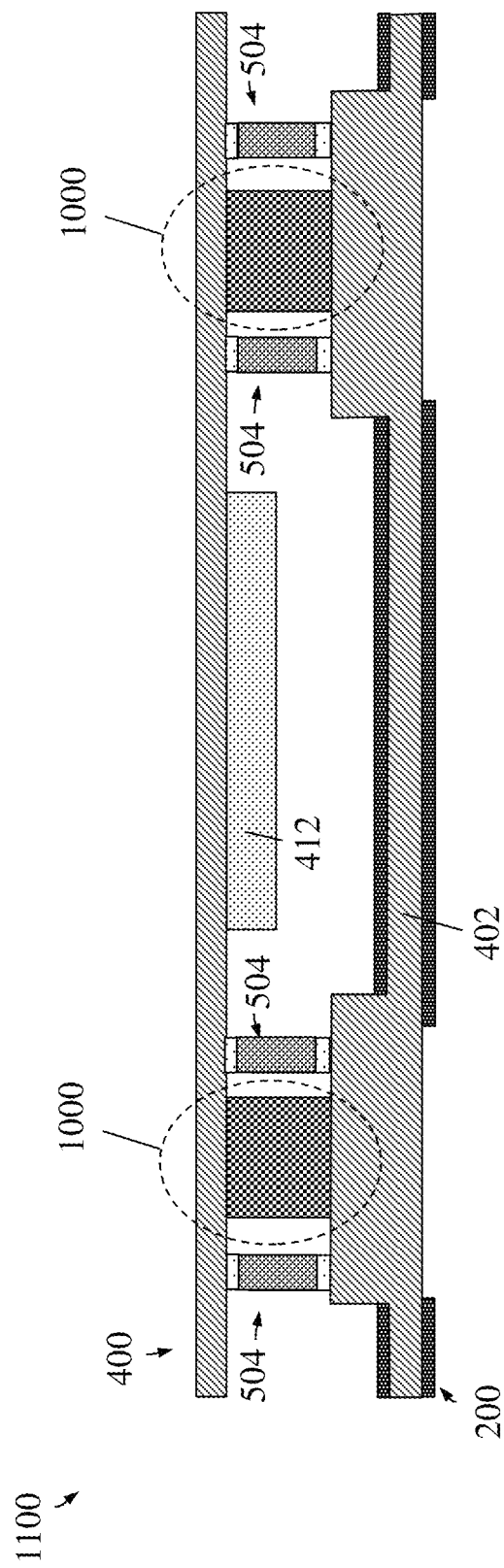
FIG. 11 is a side cross sectional view illustrating bonding of the device and cap wafers of FIG. 10.

By way of example, FIG. 10 is a side cross sectional view of a portion of a device wafer 400 to be bonded to a corresponding portion of a cap wafer 200 that results in the formation of integrated BGCSs, in accordance with another exemplary embodiment. In this embodiment, the BCGS layer(s) are formed only on the cap wafer 200. Here, the layer(s) are generally denoted at 1000, and may include one or more of the specific layers previously described as being formed on the cap wafer 200 such as, for example, AR layers, solder base metal stack layers, and getter layers. In the bonded view of FIG. 11, the BCGS layer(s) 1000 serve as the entire integrated BGCSs for the assembly 1100. Again, as with the previous embodiments, the integrated BGCSs 1000 may be located elsewhere besides the scribe regions.

Figure 12:
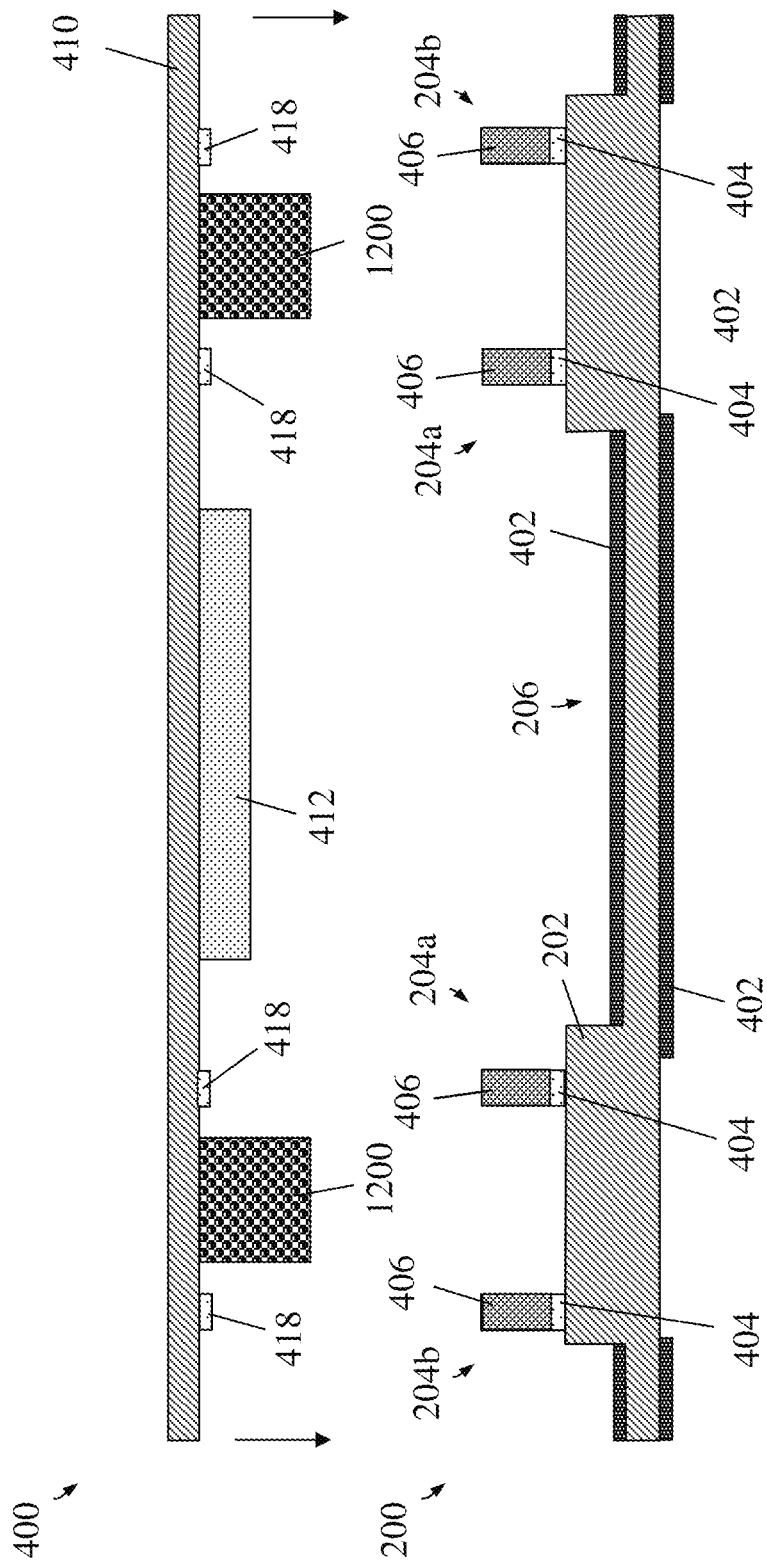
FIG. 12 is a side cross sectional view of a portion of a device wafer to be bonded to a corresponding portion of a cap wafer that results in the formation of integrated BGCSs, in accordance with another exemplary embodiment.
Figure 13:
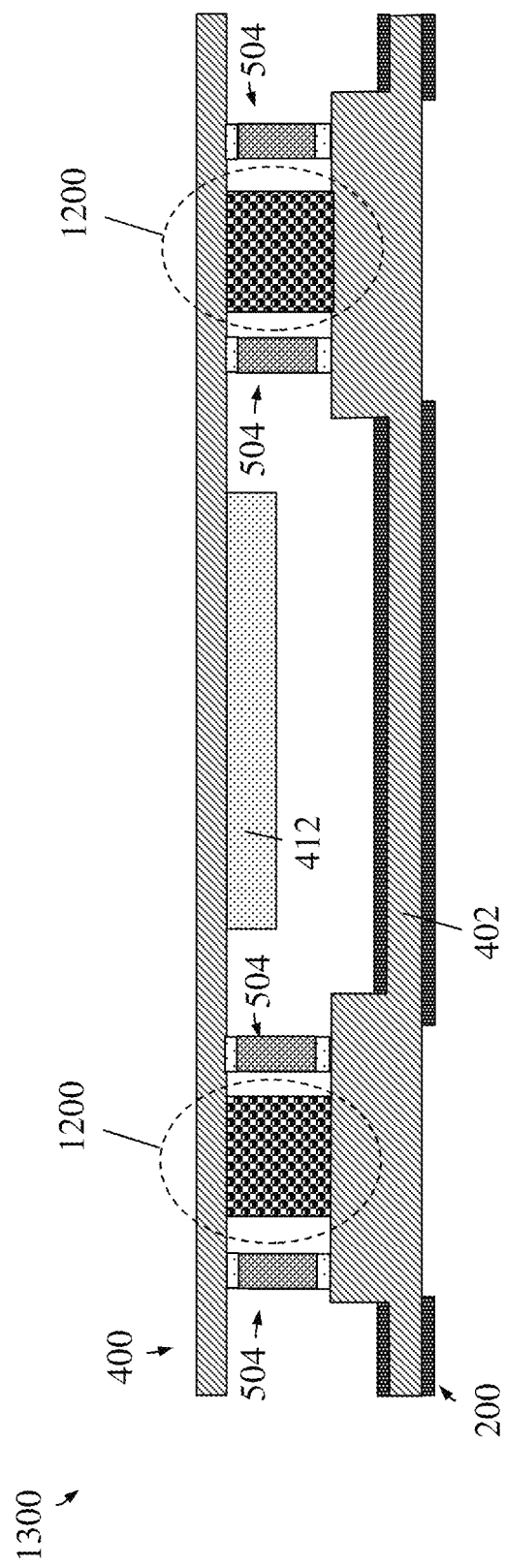
FIG. 13 is a side cross sectional view illustrating bonding of the device and cap wafers of FIG. 12.

Conversely, FIG. 12 is a side cross sectional view of a portion of a device wafer 400 to be bonded to a corresponding portion of a cap wafer 200 that results in the formation of integrated BGCSs, in accordance with another exemplary embodiment. In this embodiment, the BCGS layer(s) are formed only on the device wafer 400. The BGCS layer(s) are generally denoted at 1200, and may include one or more of the specific layers previously described as being formed on the cap wafer 400 such as, for example, solder base metal stack layers and polyimide layers. In the bonded view of FIG. 13, the BCGS layer(s) 1200 serve as the entire integrated BGCSs for the assembly 1300.

As will thus be appreciated, among the technical benefits of the above described embodiments is the elimination of added processing steps to fabricate bond gap control spacers from materials that are not used in the preparation of device or cap wafer structures. Fewer processing steps in turn results in cost reduction and less chance for yield loss. Rather, the BGCS material is advantageous taken from existing layers formed on the cap and/or device wafers that would ordinarily be removed from (or not initially formed in) the scribe regions of the wafers. Such exemplary materials include, but are not necessarily limited to, AR coatings, solder base metals, polyimides and vacuum getter layers.

While the disclosure has been described with reference to a preferred embodiment or embodiments, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular embodiment disclosed as the best mode contemplated for carrying out this disclosure, but that the disclosure will include all embodiments falling within the scope of the appended claims.

The invention claimed is:

1. A wafer level packaged circuit device, comprising:
a device wafer bonded to a cap wafer; and
an integrated bond gap control structure (BGCS) disposed between the device wafer and the cap wafer, the integrated BGCS comprising one or more material layers used in the formation of at least one of the cap wafer and the device wafer, and left remaining in a region of a substrate of at least one of the cap wafer and the device wafer;
wherein at least a portion of the integrated BGCS is formed on the cap wafer, and further comprises one or more of: a vacuum getter layer, a solder metal stack layer, and an antireflective coating layer.

2. A wafer level packaged circuit device, comprising:
a device wafer bonded to a cap wafer; and
an integrated bond gap control structure (BGCS) disposed between the device wafer and the cap wafer, the integrated BGCS comprising one or more material layers used in the formation of at least one of the cap wafer and the device wafer, and left remaining in a region of a substrate of at least one of the cap wafer and the device wafer;
wherein at least a portion of the integrated BGCS is formed on the device wafer, and further comprises one or more of: a solder metal stack layer, and a polyimide layer.

3. The device of claim 1, wherein the integrated BGCS has a thickness on the order of about 10 microns ($\mu$m).

4. The device of claim 2, wherein the integrated BGCS has a thickness on the order of about 10 microns ($\mu$m).

5. A wafer level packaged circuit device, comprising:
a device wafer bonded to a cap wafer;
an integrated bond gap control structure (BGCS) disposed between the device wafer and the cap wafer, the integrated BGCS comprising one or more material layers used in the formation of the device wafer, and left remaining in a region of a substrate of the device wafer; and
a polyimide layer formed in the region of the substrate of the device wafer, wherein the polyimide layer is a same polyimide layer that is also used in the formation of an integrated circuit on the device wafer, and wherein the integrated BGCS comprises the polyimide layer.

6. The device of claim 5, further comprising a solder metal stack layer formed on the polyimide layer, wherein the solder metal stack layer is also a same solder metal stack layer used to form a sealing ring for the device wafer, and wherein the integrated BGCS comprises the polyimide layer and the solder metal stack layer.

7. The device of claim 6, wherein the solder metal stack layer comprises a titanium/nickel/gold stack of layers.

8. The device of claim 7, wherein the polyimide layer has a thickness on the order of about 1.0 microns ($\mu$m) to about 3.0 $\mu$m, and the solder metal stack layer has a thickness on the order of about 0.4 $\mu$m to about 0.8 $\mu$m.

9. The device of claim 5, further comprising a contact metal layer formed on the polyimide layer, wherein the contact metal layer is also a same contact metal layer used to form the device wafer, and wherein the integrated BGCS comprises the polyimide layer and the contact metal layer.

10. The device of claim 5, wherein the contact metal layer comprises a titanium layer.

11. The device of claim 10, wherein the polyimide layer has a thickness on the order of about 1.0 microns ($\mu$m) to about 3.0 $\mu$m, and the contact metal layer has a thickness on the order of about 10 nm to about 100 nm.

12. The device of claim 11, wherein the integrated BGCS has a thickness on the order of about 1.01 to 3.1 microns ($\mu$m).

13. The device of claim 5, wherein the region of the substrate of the device wafer corresponds to a scribe region of the device wafer.

14. The device of claim 5, wherein the integrated BGCS has a thickness on the order of about 1.4 to 3.8 microns ($\mu$m).

15. The device of claim 5, wherein the region of the substrate of the device wafer corresponds to a scribe region of the device wafer.

16. A wafer level packaged circuit device, comprising:
a device wafer bonded to a cap wafer;
an integrated bond gap control structure (BGCS) disposed between the device wafer and the cap wafer, the integrated BGCS comprising one or more material layers used in the formation of the cap wafer, and left remaining in a region of a substrate of the cap wafer; and
an antireflective coating layer formed in the region of the substrate of the cap wafer, wherein the antireflective coating layer is a same antireflective coating layer that is also formed on a cavity portion of the cap wafer, and wherein the integrated BGCS comprises the antireflective coating layer.

17. The device of claim 16, further comprising a solder metal stack layer formed on the antireflective coating layer, wherein the integrated BGCS comprises the solder metal stack layer and the antireflective coating layer.

18. The device of claim 17, wherein the solder metal stack layer is also a same solder metal stack layer used to form a sealing ring for the cap wafer.

19. The device of claim 18, wherein the solder metal stack layer comprises a titanium/nickel/gold stack of layers.

20. The device of claim 19, wherein:
the cap wafer further comprises a vacuum getter layer formed on the solder metal stack layer, wherein the vacuum getter layer is a same vacuum getter layer that is also formed on the cap wafer; and
wherein the integrated BGCS comprises the vacuum getter layer, the solder metal stack layer, and the antireflective coating layer.

21. The device of claim 20, wherein:
the vacuum getter layer has a thickness on the order of about 0.3 μm to about 2.0 μm;
the solder metal stack layer has a thickness on the order of about 0.4 μm to about 0.8 μm; and
the antireflective coating layer has a thickness on the order of about 5.5 μm to about 8.0 μm.

22. The device of claim 16, wherein the integrated BGCS has a thickness on the order of about 6.2 to 10.8 microns (μm).

23. The device of claim 16, wherein the region of the substrate of the cap wafer corresponds to a scribe region of the cap wafer.

* * * * *